(12) United States Patent
Nishino et al.

(10) Patent No.: US 10,856,427 B2
(45) Date of Patent: Dec. 1, 2020

(54) ELECTRONIC APPARATUS AND HOUSING UNIT THAT ARE EQUIPPED WITH HOUSING MEMBER

(71) Applicant: CANON KABUSHIKI KAISHA, Tokyo (JP)

(72) Inventors: Tatsuo Nishino, Yokohama (JP); Noriyuki Takei, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/707,176

(22) Filed: Dec. 9, 2019

(65) Prior Publication Data

US 2020/0214150 A1 Jul. 2, 2020

(30) Foreign Application Priority Data

Dec. 26, 2018 (JP) .................................. 2018-243139

(51) Int. Cl.
*H05K 5/00* (2006.01)
*H05K 5/04* (2006.01)

(52) U.S. Cl.
CPC ......... *H05K 5/0065* (2013.01); *H05K 5/0086* (2013.01); *H05K 5/04* (2013.01)

(58) Field of Classification Search
CPC ...... H05K 5/0065; H05K 5/04; H05K 5/0086; H05K 9/0026; G03B 17/02
See application file for complete search history.

(56) References Cited

U.S. PATENT DOCUMENTS

| 6,031,494 A | * | 2/2000 | Okabe | H01Q 1/243 343/700 MS |
| 6,761,566 B2 | * | 7/2004 | Chin-Lung | H01R 12/712 439/76.1 |
| 7,048,558 B2 | * | 5/2006 | Fan | H01R 13/6582 439/157 |
| 8,968,030 B2 | * | 3/2015 | Zhang | H04M 1/026 439/630 |
| 2008/0101004 A1 | * | 5/2008 | Chen | H05K 7/1461 361/679.32 |
| 2012/0127688 A1 | * | 5/2012 | Yang | H05K 5/0286 361/818 |
| 2013/0016484 A1 | * | 1/2013 | Yoo | H04B 1/3833 361/752 |

(Continued)

FOREIGN PATENT DOCUMENTS

JP 2015191983 A 11/2015

*Primary Examiner* — Abhishek M Rathod
(74) *Attorney, Agent, or Firm* — Rossi, Kimms & McDowell LLP

(57) ABSTRACT

An electronic apparatus which reduces radiation noise. A housing member mounted on a circuit board fixed to a casing houses a recording medium. A metal sheet member is electrically connected to the circuit board. The housing member has a recording medium connecting clock terminal that is connected to the recording medium housed in the housing member, and a board connecting clock terminal that is connected to the circuit board. The metal sheet member has a flat portion that faces the housing member across a predetermined space, and as seen in a direction perpendicular to a flat surface of the flat portion, an area of the flat portion which faces the board connecting clock terminal is opened.

10 Claims, 3 Drawing Sheets

(56) References Cited

U.S. PATENT DOCUMENTS

| | | | | |
|---|---|---|---|---|
| 2013/0120957 A1* | 5/2013 | Werner | ................ | H05K 9/0032 361/818 |
| 2014/0251368 A1* | 9/2014 | Lawson | ................ | A45C 13/02 132/287 |
| 2018/0278814 A1* | 9/2018 | Yamamoto | ................ | G02B 7/02 |

* cited by examiner

ELECTRONIC APPARATUS AND HOUSING UNIT THAT ARE EQUIPPED WITH HOUSING MEMBER

BACKGROUND OF THE INVENTION

Field of the Invention

The present invention relates to a housing unit and an electronic apparatus that are equipped with a housing member into which a memory card or the like is to be inserted.

Description of the Related Art

If a frequency for transmitting various signals is increased in an electronic apparatus, high-frequency electromagnetic waves tend to radiate to the outside. For example, in an electronic apparatus with a card slot, in a case where a metallic component is placed close to the card slot which a recording medium such as a memory card can be inserted into and removed from, noise generated in the card slot propagates to an area to which the noise tends to radiate due to electromagnetic coupling with the metallic component. If the noise that has propagated in the electronic apparatus radiates to the outside using a cable or the like, which is connected to the electronic apparatus, as an antenna, it may become difficult to meet noise radiation levels complying with international standards.

The shorter the distance between the card slot and a conductive component such as a metallic component is, and the larger the area in which they face each other is, the higher the noise that propagates through the conductive component becomes. Therefore, anti-EMI (Electro Magnetic Interference) measures are matters to be considered particularly for small electronic apparatuses whose components are short distances apart.

To reduce radiation noise, it is conceivable that an anti-EMI component such as an electromagnetic wave absorbing sheet is attached to a metallic component. This method, however, may face problems such as an increase in cost and an increase in the size of an apparatus because of the need to secure an installation space. To address such problems, a method to reduce noise by absorbing noise using a card slot to shield a noise source such as a memory card and a conductor placed close to the noise source has been proposed (see, for example, Japanese Laid-Open Patent Publication (Kokai) No. 2015-191983).

However, in the case where the conductor for absorbing noise is placed close to the card slot which is the noise source as described in Japanese Laid-Open Patent Publication (Kokai) No. 2015-191983, noise arising from electromagnetic coupling with the conductor may propagate from the conductor to the outside.

SUMMARY OF THE INVENTION

The present invention provides an electronic apparatus which reduces radiation noise.

Accordingly, the present invention provides an electronic apparatus including: a casing; a circuit board fixed to the casing; a housing member mounted on the circuit board and configured to house a recording medium; and a metal sheet member electrically connected to the circuit board, wherein the housing member includes: a recording medium connecting clock terminal that is connected to the recording medium housed in the housing member; and a board connecting clock terminal that is connected to the circuit board, wherein the metal sheet member has a flat portion that faces the housing member across a predetermined space, and as seen in a direction perpendicular to a flat surface of the flat portion, an area of the flat portion which faces the board connecting clock terminal is opened.

Accordingly, the present invention provides a housing unit including: a circuit board; a housing member mounted on the circuit board and configured to house a recording medium; and a metal sheet member electrically connected to the circuit board, wherein the housing member includes: a recording medium connecting clock terminal that is connected to the recording medium housed in the housing member; and a board connecting clock terminal that is connected to the circuit board, wherein the metal sheet member has a flat portion that faces the housing member across a predetermined space, and as seen in a direction perpendicular to a flat surface of the flat portion, an area of the flat portion which faces the board connecting clock terminal is opened.

According to the present invention, radiation noise from the electronic apparatus is reduced.

Further features of the present invention will become apparent from the following description of exemplary embodiments (with reference to the attached drawings).

DESCRIPTION OF THE EMBODIMENTS

Embodiments of the present invention will now be described in detail with reference to the drawings. Here, an image pickup apparatus (specifically a digital camera) is taken as an example of an electronic apparatus according to the present invention, but the electronic apparatus according to the present invention is not limited to an image pickup apparatus.

Figure 1A:
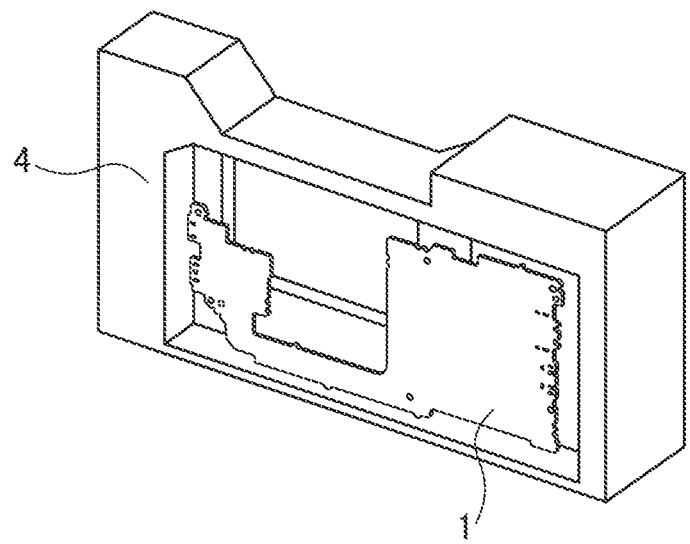
FIGS. 1A and 1B are a perspective view and an exploded perspective view, respectively, showing an internal construction of an image pickup apparatus according to a first embodiment.
Figure 1B:
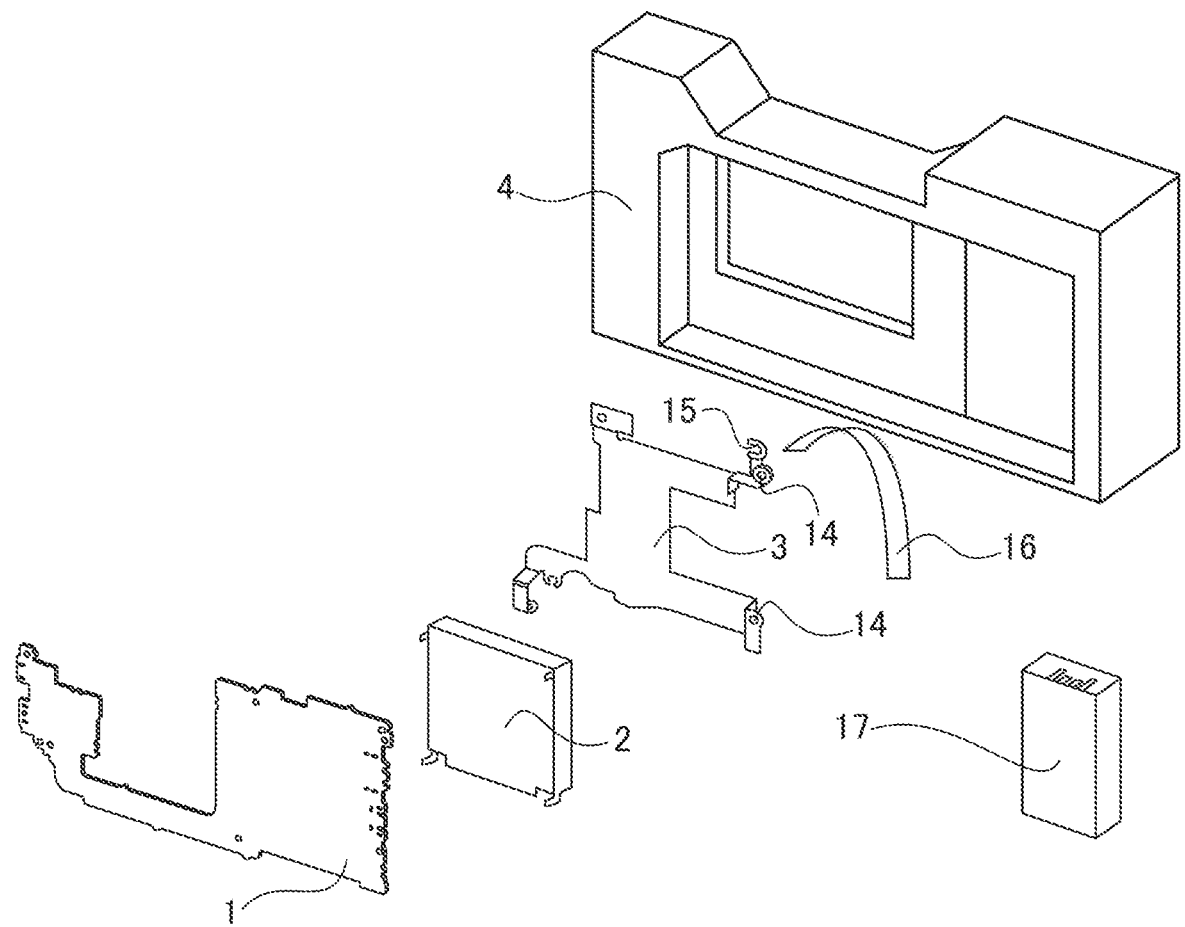

FIG. 1A is a perspective view showing an internal construction of an image pickup apparatus according to a first embodiment. FIG. 1B is an exploded perspective view of the image pickup apparatus according to the first embodiment. It should be noted that FIGS. 1A and 1B show only elements (components) related to the present invention, and description of elements other than the elements (components) related to the present invention is omitted.

The image pickup apparatus has a printed circuit board 1, a card slot 2, a grounding assisting member 3 (a metal sheet member), and a chassis 4. The printed circuit board 1, the card slot 2, and the grounding assisting member 3 make up a card slot unit (housing unit).

The chassis 4 is a component (a casing) that forms a framework of the image pickup apparatus, and here, it is assumed that the chassis 4 is formed of a metallic material (a conductive material). The card slot 2 which is a housing member housing a recording medium is mounted on the printed circuit board 1. The card slot 2 holds (houses) a memory card (for example, a recording medium such as an SD card), and the memory card can be inserted into and removed from the card slot 2.

The grounding assisting member 3 is fabricated by, for example, machining a metal sheet (a metallic plate) and has a flat portion that faces the printed circuit board 1 across a predetermined space left between them. It should be noted that the method for fabricating the grounding assisting member 3 is not limited to sheet-metal working. The grounding assisting member 3 is provided with an external connection ground terminal 15 to which a cable 16, which is electrically connected to a conductive member, not shown, constituting the image pickup apparatus is electrically connected.

The grounding assisting member 3 is also provided with two printed circuit board connecting portions 14 which are connected to the printed circuit board 1. The grounding assisting member 3 is connected to (mounted on) the printed circuit board 1 via the two printed circuit board connecting portions 14. The grounding assisting member 3 is then fixed to the chassis 4 via the two printed circuit board connecting portions 14. Both the grounding assisting member 3 and the chassis 4 are conductors (metallic components), and hence the printed circuit board 1 is electrically connected to the chassis 4, which is a ground, via the grounding assisting member 3. The construction using the grounding assisting member 3 makes it possible to electrically and reliably connect a ground wire (not shown) of the printed circuit board 1 to the ground (the chassis 4) with high mechanical strength. It should be noted that the chassis 4 may be partially formed of a nonconductive material as long as a conductor should be used for a part of the chassis 4 which is connected to the grounding assisting member 3.

Figure 2:
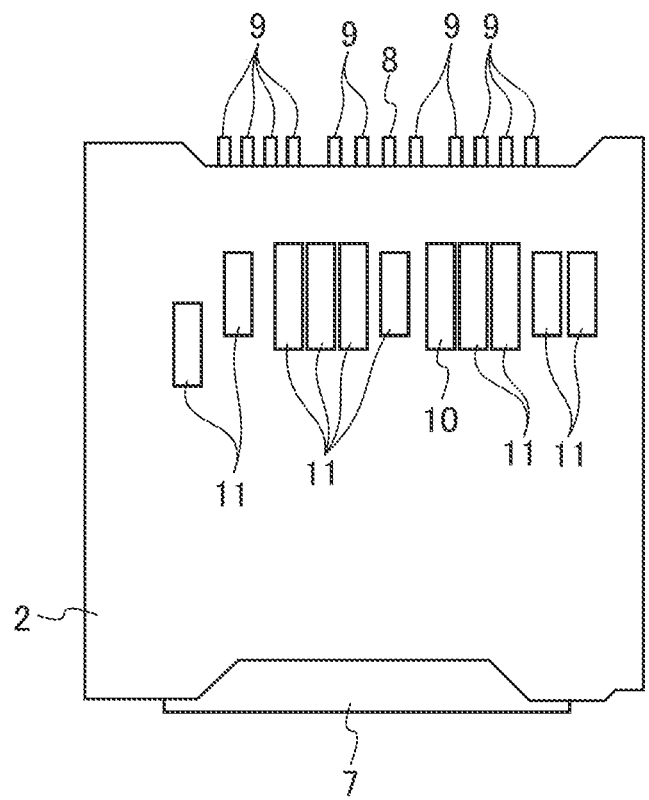
FIG. 2 is a front view of a card slot.

FIG. 2 is a front view of the card slot 2. The card slot 2 has a board connecting clock terminal 8, a plurality of terminals 9 (except for the board connecting clock terminal 8), a card connecting clock terminal 10, and a plurality of terminals 11 (except for the card connecting clock terminal 10). The board connecting clock terminal 8 and the plurality of terminals 9 are electrically connected to the printed circuit board 1. When a memory card 7 is inserted into the card slot 2, a terminal group (not shown) provided in the memory card 7 is electrically connected to the card connecting clock terminal 10 and the plurality of terminals 11.

Figure 3:
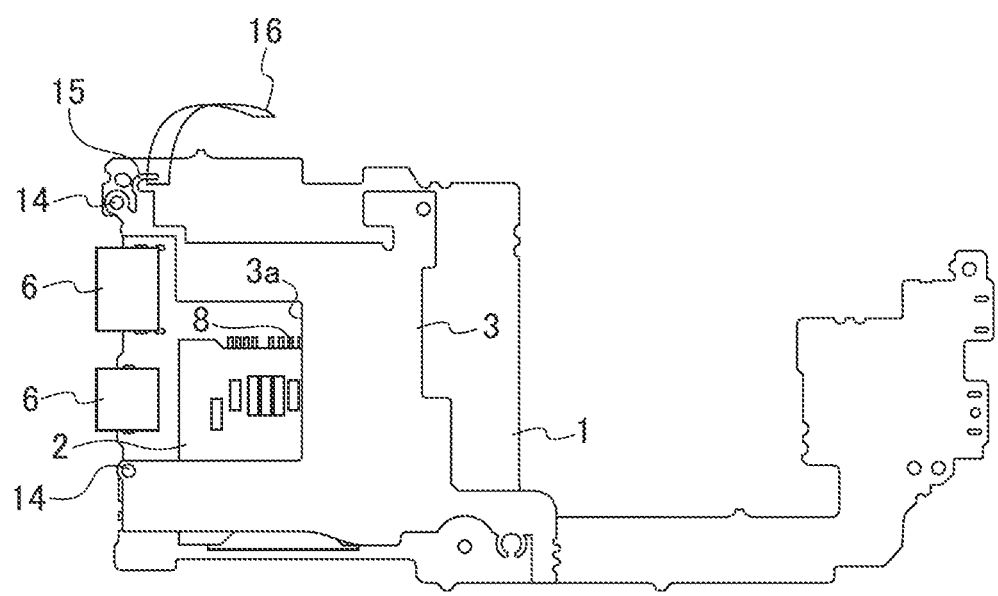
FIG. 3 is a front view showing a state in which the card slot and a grounding assisting member are mounted on a printed circuit board according to the first embodiment.

FIG. 3 is a front view showing a state in which the card slot 2 and the grounding assisting member 3 are mounted on the printed circuit board 1 according to the first embodiment (a view taken in a direction perpendicular to front and rear surfaces of the printed circuit board 1 (the flat portion of the grounding assisting member 3)). In addition to the card slot 2, connectors 6 (for example, a USB terminal and an HDMI (registered trademark) terminal) for electrically connecting the image pickup apparatus and an external apparatus (not shown) together are mounted on the printed circuit board 1.

High noise is generated from the board connecting clock terminal 8 of the card slot 2. For this reason, the flat portion of the grounding assisting member 3 is opened by providing a concave portion 3a so that there can be no area overlapping the board connecting clock terminal 8 of the card slot 2 when seen in a direction perpendicular to a flat surface of the flat portion of the grounding assisting member 3. This prevents occurrence of electromagnetic noise coupling between the card slot 2 and the grounding assisting member 3 and reduces noise generated in the grounding assisting member 3. As a result, leakage of noise from the cable 16 connected to the external connection ground terminal 15 provided in the grounding assisting member 3 is prevented, and hence high radiation noise is prevented from being generated using the cable 16 as an antenna.

For the same reason, it is preferred that the concave portion 3a provided in the flat portion of the grounding assisting member 3 is shaped such that the concave portion 3a does not overlap the card connecting clock terminal 10 of the card slot 2 either when seen in the direction perpendicular to the flat surface of the flat portion of the grounding assisting member 3.

According to the arrangement described above, electromagnetic noise coupling between the card slot 2 and the grounding assisting member 3 is prevented by reducing the area of the grounding assisting member 3 which faces the card slot 2 which is a noise source. For this reason, the radiation noise level can be lowered without additional components.

A description will now be given of other features with reference to an arrangement shown in FIG. 3. As shown in FIG. 3, the connectors 6 are placed at such locations as not to contact the grounding assisting member 3. In other words, the concave portion 3a provided in the flat portion of the grounding assisting member 3 is designed to have such a shape that there is no area where the grounding assisting member 3 and the connector 6 overlap each other when seen in the direction perpendicular to the flat surface of the flat portion of the grounding assisting member 3. As a result, even if noise generated in the card slot 2 propagates to the grounding assisting member 3 due to electromagnetic coupling between the card slot 2 and the grounding assisting member 3, propagation of the noise from the grounding assisting member 3 to the connector 6 is prevented. This prevents noise from radiating externally using cables, not shown, which are connected to the connectors 6, as antennas.

In the image pickup apparatus according to the first embodiment, a battery box which is a housing space for a battery 17 (see FIGS. 1A and 1B) is provided in the chassis 4 close to the card slot 2. By opening and closing a common lid member, the memory card 7 is inserted into and removed from the card slot 2, and the battery 17 is inserted into and removed from the chassis 4. The battery 17 housed in the battery box faces the card slot 2 across the grounding assisting member 3.

Assume here that the battery box is equipped with a component, not shown, for connecting to an external power supply (hereafter referred to as "the component for the external power supply"), instead of the battery 17. The component for the external power supply has a cable, not shown, which enables connection to the external power supply. In the state in which the battery box is equipped with the component for the external power supply, a ground of the component for the external power supply is electrically connected to the grounding assisting member 3. At this time, radiation of noise from the cable of the component for the external power supply can be prevented because the grounding assisting member 3 is configured such that electromagnetic coupling with the card slot 2 and the connector 6 is not likely to occur as described above.

Figure 4:
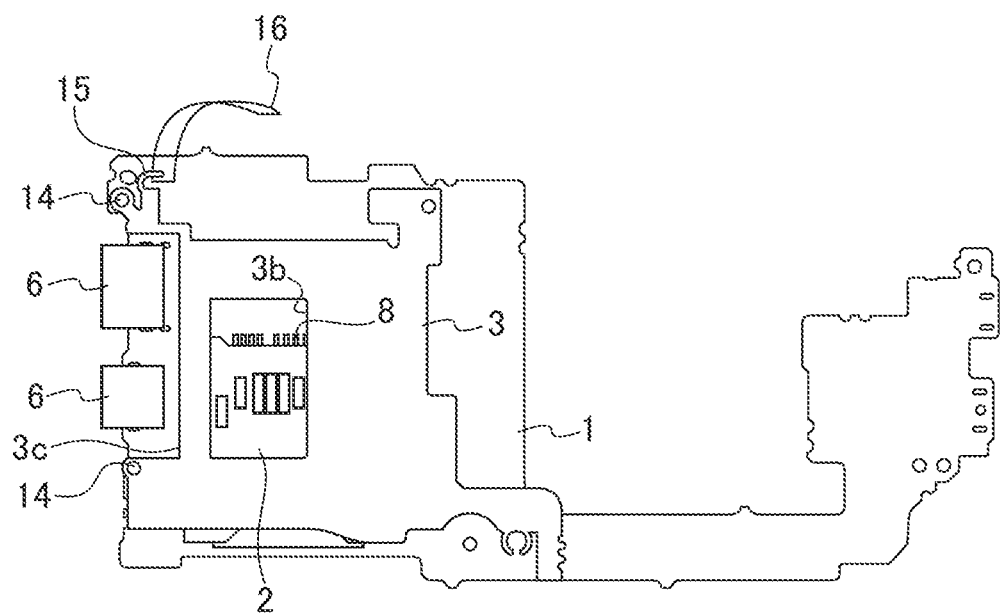
FIG. 4 is a front view showing a state in which the card slot and a grounding assisting member are mounted on a printed circuit board according to a second embodiment.

In the following description of a second embodiment, the same components and elements corresponding to those of the first embodiment are denoted by the same reference symbols, and detailed description thereof is omitted. FIG. 4 is a front view showing a state in which the card slot 2 and the grounding assisting member 3 are mounted on the printed circuit board 1 according to the second embodiment.

In the first embodiment described above, the grounding assisting member 3 has the concave portion 3a. On the other hand, in place of the concave portion 3a, a hole portion 3b and a concave portion 3c are formed in the flat portion of the grounding assisting member 3 according to the second embodiment. The hole portion 3a is located in an area which faces the board connecting clock terminal 8 and the card connecting clock terminal 10 of the card slot 2 when seen in the direction perpendicular to the flat surface of the flat portion of the grounding assisting member 3. This prevents occurrence of electromagnetic noise coupling between the card slot 2 and the grounding assisting member 3 as with the first embodiment. Also, the concave portion 3c is located in an area which faces the connector 6, that is, an area that circumvents the locations at which the connectors 6 are mounted when seen in the direction perpendicular to the flat surface of the flat portion of the grounding assisting member 3. This prevents propagation of noise from the grounding assisting member 3 to the connectors 6.

In the following description of a third embodiment, the components and elements corresponding to those of the first embodiment are denoted by the same reference symbols, and detailed description thereof is omitted. The following description of the third embodiment focuses on relationship between the placement of connecting portions of the grounding assisting member 3 with respect to the printed circuit board 1 and the shape of the grounding assisting member 3.

Figure 5:
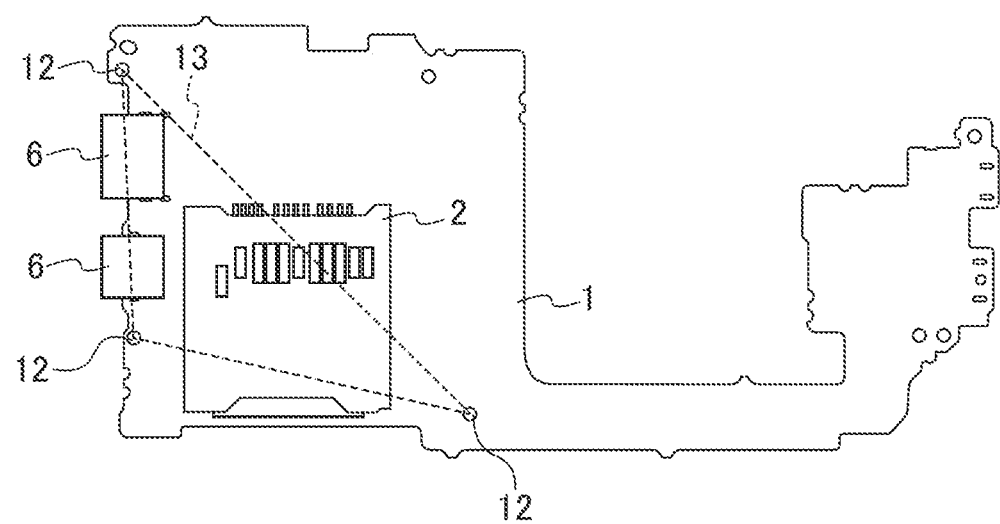
FIG. 5 is a front view showing a state in which the card slot is mounted on a printed circuit board according to a third embodiment.

FIG. 5 is a front view showing a state in which the card slot 2 are mounted on the printed circuit board 1 according to the third embodiment. It is assumed that there are three connecting portions 12 which connect the grounding assisting member 3 (not shown in FIG. 5) or the chassis 4 to the printed circuit board 1. In this case, it is preferred that as seen in the direction perpendicular to the flat surface of the flat portion of the grounding assisting member 3, an area corresponding to a triangular surface formed by broken lines 13 connecting the three connecting portions 12 in the flat portion of the grounding assisting member 3 covers no less than half the area of the card slot 2. In other words, the shapes of the chassis 4, the grounding assisting member 3, and the printed circuit board 1 and the locations of the connecting portions 12 are determined so as to satisfy the above conditions.

In this case, even if static electricity is applied to the image pickup apparatus from the outside, electric current can be passed from the external connection ground terminal 15 to the ground, and electric components such as the memory card 7 and an IC (not shown) mounted on the printed circuit board 1 can be protected. It should be noted that the basic shape of the grounding assisting member 3 corresponds to that of the first and second embodiments described above, and hence the effect of reducing radiation noise from the grounding assisting member 3 can be obtained as with the first and second embodiments.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-243139, filed Dec. 26, 2018, which is hereby incorporated by reference herein in its entirety.

What is claimed is:

1. An electronic apparatus comprising:
   a casing;
   a circuit board fixed to the casing;
   a housing member mounted on the circuit board and configured to house a recording medium; and
   a metal sheet member electrically connecting the circuit board to the casing,
   wherein the housing member comprises:
      a recording medium connecting clock terminal that is connected to the recording medium housed in the housing member; and
      a board connecting clock terminal that is connected to the circuit board, and
   wherein the metal sheet member has a flat portion that faces the housing member across a predetermined space, and as seen in a direction perpendicular to a flat surface of the flat portion, an area of the flat portion which faces the board connecting clock terminal is opened.

2. The electronic apparatus according to claim 1, wherein as seen in the direction perpendicular to the flat surface of the flat portion, an area of the flat portion which faces the recording medium connecting clock terminal is opened.

3. The electronic apparatus according to claim 1, wherein a cut or a hole is formed in the area of the flat portion which faces the board connecting clock terminal.

4. The electronic apparatus according to claim 1, comprising
   a conductive member placed in the casing,
   wherein in the vicinity of the housing member, the metal sheet member is electrically connected to the conductive member.

5. The electronic apparatus according to claim 1, comprising
   a connector mounted on the circuit board,
   wherein the connector is not in contact with the metal sheet member, and as seen in the direction perpendicular to the flat surface of the flat portion, the flat portion has no area that faces the connector.

6. The electronic apparatus according to claim 1, wherein the metal sheet member is connected to the circuit board via three connecting portions, and
   as seen in the direction perpendicular to the flat surface of the flat portion, an area corresponding to a triangular surface formed by lines connecting the three connecting portions in the flat portion covers no less than half the area of the housing member.

7. The electronic apparatus according to claim 1, wherein the circuit board is connected to the casing via three connecting portions, and
   as seen in the direction perpendicular to the flat surface of the flat portion, an area corresponding to a triangular surface formed by lines connecting the three connecting portions in the flat portion covers no less than half the area of the housing member.

8. The electronic apparatus according to claim 1, wherein the casing comprises a battery box that faces the housing member across the flat portion of the sheet metal member,
   a component for an external power supply which has a cable is capable of being mounted on the battery box, and a ground of the component for an external power supply is electrically connected to the sheet metal member in a state in which the component for the external power supply is housed in the battery box.

9. The electronic apparatus according to claim 1, wherein the casing is formed of metal.

10. A housing unit comprising:
a circuit board;
a housing member mounted on the circuit board and configured to house a recording medium; and
a metal sheet member electrically connecting the circuit board to the housing unit,
wherein the housing member comprises:
a recording medium connecting clock terminal that is connected to the recording medium housed in the housing member; and
a board connecting clock terminal that is connected to the circuit board, and
wherein the metal sheet member has a flat portion that faces the housing member across a predetermined space, and as seen in a direction perpendicular to a flat surface of the flat portion, an area of the flat portion which faces the board connecting clock terminal is opened.

* * * * *